METHOD AND MATERIALS FOR THERMOELECTRIC BODIES

Filed May 12, 1961

INVENTORS
ERIC F. HOCKINGS &
WALTER L. MULARZ
BY W.S. Hill
AGENT

United States Patent Office 3,037,065

Patented May 29, 1962

3,037,065
METHOD AND MATERIALS FOR THERMOELECTRIC BODIES

Eric F. Hockings, Princeton, N.J., and Walter L. Mularz, Winchester, Mass., assignors to Radio Corporation of America, a corporation of Delaware Filed May 12, 1961, Ser. No. 109,710
12 Claims. (Cl. 136—5)

Figure 1:
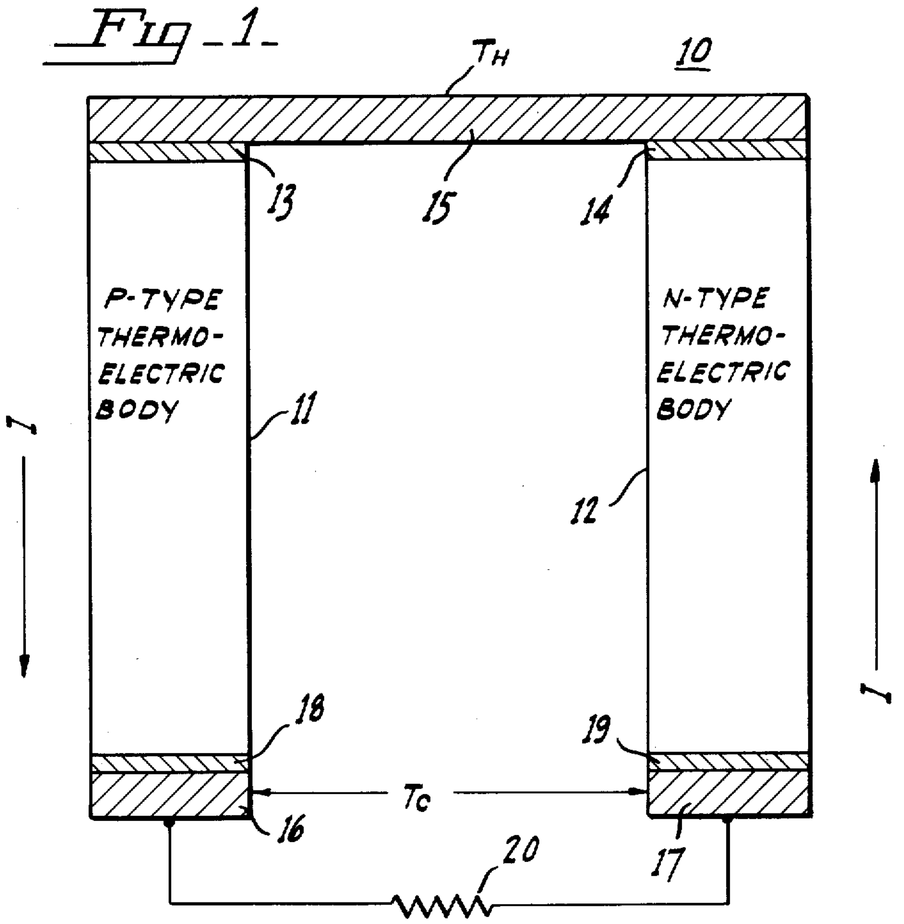

This invention relates to improved thermoelectric devices and to improved methods of fabricating such devices. More particularly, the invention relates to improved materials and methods for obtaining mechanically strong, low-resistance contacts to thermoelectric bodies.

Thermoelectric components or circuit members are made of bodies of thermoelectric materials such as bismuth telluride, lead telluride, antimony telluride, germanium telluride, silver indium telluride, silver gallium telluride, copper gallium telluride, silver antimony telluride, and the like. Similar compounds of selenium, for example silver antimony selenide, and of sulfur, for example the rare earth sulfides, also exhibit thermoelectric effects. Such compounds containing at least one member of the group consisting of sulfur, selenium and tellurium are generally known as chalcogenides. While the pure compounds may be utilized, thermoelectric compositions usually consist of alloys or solid solutions of more than one compound. Small amounts of various additives or doping agents may be incorporated in the thermoelectric composition to modify the conductivity type of the material.

Thermoelectric devices which convert heat energy directly into electrical energy by means of the Seebeck effect generally comprise two thermoelectric bodies bonded to a block of metal, which may, for example, be copper, to form a thermoelectric junction. The thermoelectric bodies which compose a thermoelectric device are known as thermoelements, and are sometimes referred to as thermoelectric components or thermoelectric circuit members. The two thermoelectric bodies are of thermoelectriaclly complementary types, that is, one thermoelement is made of P-type thermoelectric material and the other of N-type thermoelectric material. Whether a particular thermoelectric material is designated N-type or P-type depends upon the direction of current flow across the cold junction of a thermocouple formed by the thermoelectric material in question and a metal such as copper or lead, when the thermocouple is operating as a thermoelectric generator according to the Seebeck effect. If the current in the external circuit flows from the thermoelectric material, then the material is designated as "P-type"; if the current in the external circuit flows toward the thermoelectric material, then the material is designated as "N-type." The present invention relates to both P-type and N-type thermoelectric materials. Preferably these materials contain at least 5 weight percent of at least one member of the group consisting of sulfur, selenium, and tellurium.

A good thermoelectric material should have a low electrical resistivity, since the Seebeck E.M.F. generated in energy converters of this type is dependent upon the temperature difference between the hot and cold junctions. The generation of Joulean heat in the thermoelectric device due to the electrical resistance of either the thermoelectric members, or the auxiliary components, or the electrical contacts to the two members, will reduce the efficiency of the device.

Thermoelectric devices which utilize electrical energy for environmental cooling and refrigeration by means of the Peltier effect also include two thermoelectrically complementary thermoelements bonded to a block of metal. In these devices, a typical thermoelectric junction uses 30 amperes at 0.1 volt. Accordingly, if any high resistance contacts are present, considerable Joulean heat will be dissipated, and the efficiency of the device will be decreased. The presence of high resistance contacts on the thermoelectric bodies has been a serious problem in the fabrication of both Seebeck and Peltier thermoelectric devices. High resistance contacts can reduce the cooling produced by Peltier devices as much as 40% below the theoretical maximum value. A contact resistance of only ¼ of the sum of the resistance of the two thermoelements in a Peltier device can reduce the amount of Peltier cooling by as much as 25%. For a more complete discussion of the effect of contact resistance on maximum cooling obtained in Peltier devices, see chapter 8, "Evaluation and Properties of Materials for Thermoelectric Applications," by F. D. Rosi and E. G. Ramberg, in "Thermoelectricity," edited by P. H. Egli, John Wiley and Sons, Inc., New York, 1960.

It is therefore an object of the instant invention to provide improved thermoelectric devices.

Another object of the invention is to provide improved methods for obtaining low resistance, mechanically strong electrical connections to thermoelectric bodies.

A further object of the invention is to provide improved methods for obtaining low resistance, mechanically strong electrical bonds between a metal body and a thermoelectric body.

Still another object of the invention is to provide improved electrical connections to thermoelements in thermoelectric devices.

Another object is to provide a low resistance electrical connection between a metal body and a thermoelement which comprises at least one element selected from the group consisting of sulfur, selenium and tellurium.

Another object of the invention is to provide a low resistance bond between two thermoelectric bodies, each body comprising at least one element selected from the group consisting of sulfur, selenium and tellurium.

These and other objects and advantages of the instant invention are accomplished by applying to a surface of a thermoelectric body comprising at least one member of the group consisting of sulfur, selenium and tellurium a solder consisting essentially of a mixture of mercury and tellurium containing 30 to 51 atomic percent tellurium, balance mercury. A mixture containing about 50 atomic percent mercury and 50 atomic percent tellurium has been found particularly advantageous. The metal body to be joined with the thermoelectric body is also coated with the same mercury-tellurium solder. The coated surface of the thermoelectric body and the coated surface of the metal body are then pressed together, and the mercury-tellurium mixture is allowed to set at room temperature for a short time. The mercury and tellurium react during this period to form mercury telluride. A mechanically strong, low electrical resistance bond is thus formed between the thermoelectric body and the metal body. Thereafter electrical lead wires are readily attached to the metal body. The method of the invention may also be utilized to bond one thermoelectric body to another thermoelectric body.

Figure 2:
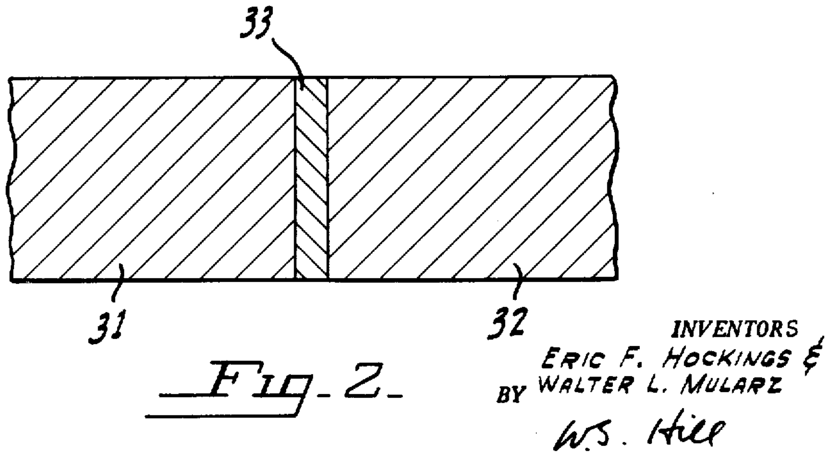

The invention will be described in greater detail by the following examples, in conjunction with the accompanying drawings, in which:

FIGURE 1 is a cross-sectional view of a thermoelectric Seebeck device comprising two thermoelectrically complementary thermoelements bonded at one end to the same metal plate and bonded at the other end to metal contact blocks in accordance with a first embodiment of the invention; and, FIGURE 2 is a corss-sectional view of one thermoelectric body bonded to another thermoelectric body in accordance with a second embodiment of the invention.

Referring now to FIGURE 1, the thermoelectric device 10 comprises a thermoelectric body 11, which may, as illustrated, be P-type, and a complementary type thermoelectric body 12, which in this example is N-type, as illustrated in the drawing. Each thermoelectric body comprises at least 5 weight percent of at least one member of the group consisting of sulfur, selenium and tellurium. It will be understood that the conductivity types of bodies 11 and 12 may be reversed. One end of thermoelectric body 11 is bonded to an electrical contact 16, and one end of thermoelectric body 12 is similarly bonded to an electrical contact 17. Advantageously, contacts 16 and 17 are blocks of metal such as copper, silver, or the like. The bonds between thermoelectric bodies 11 and 12 and their respective contacts 16 and 17 consist of solder layers 18 and 19 respectively. The other ends of the thermoelectric bodies 11 and 12 are bonded to an intermediate member 15, in the form of a buss bar or plate. Member 15 is made of a material which is thermally and electrically conductive, and has negligible thermoelectric power. Bodies of metal such as silver, copper, and the like, or metallic alloys, are suitable for this purpose. In this example, intermediate member 15 consists of a copper plate. The bond between thermoelectric bodies 11 and 12 and the metal plate 15 consists of solder layers 13 and 14 respectively. The low-resistance solder layers 13, 14, 18 and 19 consist of a combination of mercury and tellurium composed of 30 to 51 atomic percent tellurium, balance mercury. In this example, the solder consists of 50 atomic percent tellurium and 50 atomic percent mercury.

In the operation of the thermoelectric device 10, the metal plate 15 (and its junctions to the thermoelectric bodies 11 and 12) are heated to a temperature $T_H$ and becomes the hot junction of the device. The metal contacts 16 and 17 on thermoelements 11 and 12, respectively, are maintained at a temperature $T_C$ which is lower than the temperature ($T_H$) of the hot junction of the device. The lower or cold junction temperature ($T_C$) may, for example, be room temperature. A temperature gradient is thus established in each thermoelement 11 and 12, from a high temperature adjacent plate 15 to a low temperature adjacent contacts 16 and 17, respectively. The electromotive force developed under these conditions produces in the external circuit a flow of conventional current (I) in the direction shown by arrows in FIGURE 1; that is, the current flows in the external circuit from the P-type thermoelement 11 toward the N-type thermoelement 12. The device is utilized by connecting a load, shown as a resistance 20 in the drawing, between the contacts 16 and 17 of thermoelements 11 and 12, respectively.

EXAMPLE I

The P-type thermoelectric body 11 may, for example, consist of bismuth telluride and 5 to 70 mol percent antimony telluride alloyed with up to 2 weight percent of one or more of the oxides of copper, silver, gold, and mercury, as described in U.S. Patent 2,953,616, issued September 20, 1960 to L. Pessel and T. Q. Dziemianowicz, and assigned to the same assignee as that of the instant application. The N-type thermoelectric body 12 may for example consist of bismuth telluride containing .10 to .50 weight percent excess bismuth, .27 to .80 weight percent antimony, and .13 to .40 weight percent copper, as described in U.S. Patent 2,951,105, issued to C. J. Busanovich on August 30, 1960 and assigned to the assignee of the instant application.

A mechanically strong low-resistance electrical bond between the P-type thermoelectric body 11 and the metal contact block 16 is attained according to the invention as follows. Advantageously, the surface of the thermoelectric body to be bonded is first mechanically cleaned. Simply rubbing the surface to be bonded with emery paper has been found sufficient for this purpose. The surface of the metal contact block 16 to be bonded is also mechanically cleaned in a similar manner. The cleaned surface of the thermoelectric body 11 and the cleaned surface of the metal block 16 are then coated with a mercury-tellurium mixture. In this example, the mixture is prepared by intimately grinding 31.9 grams powdered tellurium in a mortar with 50.1 grams mercury. This mixture contains 50 atomic percent mercury and 50 atomic percent finely-divided or comminuted tellurium. The mercury-tellurium mixture may be applied with a brush. Altrnatively, the cleaned surface of the thermoelectric body and of the metal body may be dipped into a container of the mixture. The mixture should be freshly prepared, since it begins to set and harden as soon as it is prepared.

The coated surface of the thermoelectric body or thermoelement 11 is then pressed into close contact with the coated surface of metal block 16, which in this example consists of copper. Pressure may be applied to the two bodies by such means as a spring-loaded jig. The exact pressure between the thermoelectric body or thermoelement and the metal body is not critical in the practice of the invention, since a light pressure is sufficient to wring out any excess solder between the two bodies, leaving a layer 18 of the mercury-tellurium solder between them. The assemblage of the thermoelectric body 11 and the metal body 16 is thus kept under pressure at room temperature while the mercury-tellurium mixture sets and gradually hardens to form a mechanically strong low electrical resistance bond between the two bodies. A period of time of about ½ to 2 hours is sufficient for this purpose. During this period the mercury and tellurium react at least partially to form mercury tellurides in this example.

An important advantage of the method of the invention is that fluxing of the thermoelectric body and the metal body is not required. Furthermore, elaborate degreasing procedures or ultrasonic cleaning methods are not required prior to the application of the mercury-tellurium solder. The method is thus simple and inexpensive.

Another feature of the invention is that no heat is required, since a strong bond is formed at room temperature. This avoids the necessity for the use of hot plates or other heating equipment, and hence further contributes to the simplicity and low cost of the method of the invention.

Still another feature of the invention is that although the bonding process takes place at room temperature, the joint thus formed between a thermoelectric body and a metal body, or between two thermoelectric bodies, is capable of withstanding a relatively high temperature, so that a Seebeck device according to the invention may be operated with the hot junction at a temperature as high as about 630° C. The mercury-tellurium solder layers 13, 14, 18 and 19 of the thermocouple in this example have a melting point of 666° C. Since a thermocouple is a heat engine operating between two different temperature levels, it is desirable to employ the device with as high an input temperature as possible in order to increase efficiency. The high melting point of the solders of this invention enable utilization of high input temperatures in Seebeck devices, and hence increase the Carnot efficiency of such devices.

Another feature of the invention is that bonds thus produced have a low electrical resistance, of the order of $5 \times 10^{-4}$ ohms per cm.².

EXAMPLE II

A mechanically strong, low electrical resistance bond between a metal block and a thermoelectric body comprising at least 5 weight percent of at least one member of the group consisting of sulfur, selenium and tellurium is obtained in a manner similar to that described in Example I above, but utilizing a solder consisting of 30 atomic percent tellurium, balance mercury. In this example, the thermoelectric device 10 comprises a P-type thermoelectric body 11 which consists of 55 to 65 mol percent tellurium, 17–32 mol percent bismuth, 8–23 mol percent antimony, up to 0.56 weight percent of at least one element from the group consisting of silver, mercury and gold, and up to 1.7 weight percent of at least one element selected from the group consisting of selenium and sulfur, as described in U.S. Patent 2,762,857 issued to N. Lindenblad on September 11, 1956 and assigned to the assignee of the instant invention. The N-type thermoelectric body 12 may consist, for example, of 95 to 60 mol percent bismuth telluride and 5 to 40 mol percent bismuth selenide, with .13 to .34 weight percent copper sulfide or silver sulfide, as described in U.S. Patent 2,902,528, issued to F. D. Rosi on September 1, 1959 and assigned to the assignee of the instant application. The surface of the thermoelectric body to be bonded is mechanically cleaned as described above in Example I, coated with 30 atomic percent tellurium-70 atomic percent mercury solder, and pressed against a similarly coated surface of a metal plate such as 15 or a metal contact block such as 16 and 17 for a period of about ½ to 2 hours. The bond thus formed is satisfactory at temperatures as high as about 630° C.

EXAMPLE III

According to another embodiment of the invention, a mechanically strong low electrical resistance bond is made between a metal body and a thermoelectric body or thermoelement comprising at least 5 weight percent of at least one member of the group consisting of sulfur, selenium and tellurium in a manner similar to that described in Example I above, but utilizing a solder consisting of 40 atomic percent tellurium, balance mercury. In this example, the thermoelectric device 10 comprises a P-type thermoelectric body 11 which may consist, for example, of silver antimony telluride or of any of the P-type thermoelectric compositions mentioned above. Alternatively, the P-type thermoelectric body 11 may consist of silver antimony selenide. The N-type thermoelectric body 12 may consist, for example, of 95 to 30 mol percent bismuth telluride and 5 to 70 mol percent antimony telluride with .01 to 1.0 weight percent of a halide of bismuth or antimony, as described in U.S. Patent 2,957,937, issued to R. V. Jensen and F. D. Rosi on October 25, 1960, and assigned to the assignee of the instant application. Mercury-tellurium mixtures containing less than 51 atomic percent tellurium are preferred.

EXAMPLE IV

The method of the invention may also be utilized as follows to form a mechanically strong, low electrical resistance bond between two thermoelectric bodies, each of which comprises at least 5 weight percent of at least one member of the group consisting of sulfur, selenium and tellurium.

Referring now to FIGURE 2, the two thermoelectric bodies 31 and 32 may consist, for example, of any of the P-type or N-type thermoelectric compositions mentioned above which comprise at least 5 weight percent of at least one element selected from the group consisting of antimony, bismuth, sulfur, selenium and tellurium. In this example, the first thermoelectric body 31 consists of N-type bismuth telluride containing up to 1.64 weight percent of at least 1 member of the group copper sulfide, silver sulfide, copper selenide and silver selenide, as described in U.S. Patent 2,902,529, issued to C. J. Busanovich on September 1, 1959 and assigned to the assignee of the instant application. Alternatively, the thermoelectric body 31 may consist of silver antimony sulfide, or of a sulfide of one of the rare earth elements, such as cerium sulfide.

Advantageously, the second thermoelectric body 32 is of the same conductivity type as the first thermoelectric body 31. It has been found that when a composite thermoelement of given conductivity type is fabricated with one portion consisting of a first thermoelectric material having a first energy gap bonded to a second portion consisting of a second thermoelectric material having a second energy gap, then increased efficiency in the conversion of heat to electrical power is obtained providing the composite thermoelement is utilized with the portion of higher energy gap adjacent the hot junction of the thermocouple, and the portion of lower energy gap adjacent the cold junction of the device. In such an arrangement, each thermoelectric material is being utilized in the temperature range in which it is most efficient. See FIGURE 3 of Rosi, Dismukes and Hockings, Semiconductor Materials for Thermoelectric Power Generation up to 700° C., Electrical Engineering, June, 1960. However, this increased efficiency is obtained only if the bond between the two thermoelectric materials is of low electrical resistivity.

A portion of the surface of thermoelectric bodies 31 and 32 is mechanically cleaned as described in Example I. The cleaned portions, which may for example be one end of a cylindrical body, are then coated with a solder consisting of 30 to 50 atomic percent tellurium, balance mercury. The two solder-coated surfaces are then pressed together for a period of about ½ to 2 hours. During this period a layer 33 of the solder hardens and forms a mechanically strong low electrical resistance bond between thermoelectric bodies 31 and 32.

The measured electrical resistance of the bond fabricated according to the invention between a metal body and a thermoelectric body, and the resistance of a bond similarly fabricated between two thermoelectric bodies, is set forth in Table I for some materials commonly used in thermoelectric devices. In each case the solder consisted of 50 atomic percent tellurium-50 atomic percent mercury.

*Table I*

| Body I | Solder | Body II | Junction Resistance (ohms per cm.²) |
|---|---|---|---|
| (1) Cu | HgTe | $AgSbTe_2$ | $8.5\times10^{-4}$ |
| (2) Cu | HgTe | $AgSbTe_2$ | $6.7\times10^{-4}$ |
| (3) Ag | HgTe | $Bi_2Te_3$ | $3.7\times10^{-5}$ |
| (4) $AgSbTe_2$ | HgTe | $AgSbTe_2$—GeTe | $1.1\times10^{-4}$ |
| (5) $AgSbTe_2$—GeTe | HgTe | $AgSbTe_2$—GeTe | $3.7\times10^{-4}$ |
| (6) $AgSbTe_2$ | HgTe | $AgSbTe_2$—GeTe | $4.5\times10^{-4}$ |
| (7) $AgSbTe_2$ | HgTe | $Sb_2Te_3$ | $8.4\times10^{-4}$ |
| (8) $Sb_2Te_3$ | HgTe | $Sb_2Te_3$ | $6.3\times10^{-5}$ |

It has been found that some solders tend to deteriorate and exhibit increased electrical resistivity after they have been heated. Such poor resistance to thermal cycling is particularly undesirable in solders utilized in Seebeck effect devices, which of necessity are exposed to elevated temperatures during normal operation. Accordingly, some of the assemblages of the above examples (numbers 3 and 6–8) were tested for thermal stability by heating the assemblage for some hours at temperatures of 400° to 500° C., cooling the assemblage to room temperature, and again measuring the electrical resistance of the junction. The results are tabulated in Table II. Although the electrical resistance of the junctions increased somewhat, the junction resistance was still acceptably low after the thermal cycling. In fact, in the case of assemblage 7, the electrical resistivity declined slightly after thermal cycling.

*Table II*

| Assemblage | Initial Junction Resistance, ohms per cm.² | Heat Treatment | | Final Resistance, ohms per cm.² |
|---|---|---|---|---|
| | | T° C. | Hours | |
| (3) | $3.7\times10^{-5}$ | 400 | 4 | $4.5\times10^{-5}$ |
| (6) | $4.5\times10^{-4}$ | 450 | 4 | $2.1\times10^{-3}$ |
| (7) | $8.4\times10^{-4}$ | 450 | 4 | $8.3\times10^{-4}$ |
| (8) | $6.3\times10^{-5}$ | 500 | 5 | $1.1\times10^{-4}$ |

It will be understood that the embodiments described above are by way of example only, and not limitation. Various modifications may be made without departing from the spirit and scope of the instant invention. For example, the contact blocks 16 and 17 may be formed of alloys instead of pure metals.

What is claimed is:

1. The method of bonding a thermoelectric body to a body of material selected from the group consisting of metals and thermoelectric materials, comprising the steps of coating the surfaces to be joined with a mixture of mercury and comminuted tellurium, said mixture containing from 30 to 50 atomic percent tellurium, and pressing said coated surfaces together for a time sufficient to permit hardening of said mixture.

2. The method of bonding a metal body to a thermoelectric body, comprising the steps of coating at least a portion of the surface of each of said bodies with a mixture consisting essentially of mercury and comminuted tellurium, said mixture containing from 30 to 50 atomic percent tellurium, and contacting said coated surfaces of said bodies while applying pressure therebetween.

3. The method according to claim 2, wherein said mixture comprises 50 atomic percent mercury and 50 atomic percent tellurium.

4. The method acording to claim 2, wherein said thermoelectric body is composed of at least 5 weight percent of at least one element from the group consisting of sulfur, selenium and tellurium.

5. The method of bonding two thermoelectric bodies, comprising coating at least a portion of the surface of each said body with a mixture of mercury and comminuted tellurium, said mixture containing from 30 to 50 atomic percent tellurium, and contacting said coated surfaces of said bodies while applying pressure therebetween.

6. The method as in claim 5, wherein each said thermoelectric body is composed of at least 5 weight percent of at least one element selected from the group consisting of sulfur, selenium and tellurium.

7. A thermoelectric device comprising a thermoelectric body and a metal body bonded by a solder consisting essentially of tellurium and mercury, said solder containing from 30 to 50 atomic percent tellurium, balance mercury.

8. A thermoelectric device including a thermoelement having a low electrical resistance contact bonded thereto, said contact comprising a metal body bonded to said thermoelement by a solder layer consisting essentially of 30 to 50 atomic percent tellurium, balance mercury.

9. A thermoelectric device including a thermoelement having a low electrical resistance contact bonded thereto, said thermoelement including at least 5 weight percent of at least one element selected from the group consisting of sulfur, selenium and tellurium, said contact comprising a metal body bonded to said thermoelement by a solder layer consisting essentially of tellurium and mercury, said mixture containing from 30 to 50 atomic percent tellurium, balance mercury.

10. A composite thermoelement comprising two different thermoelectric bodies bonded together by a solder layer consisting essentially of 30 to 50 atomic percent tellurium, balance mercury.

11. A composite thermoelement comprising two different thermoelectric bodies bonded together by a solder layer consisting essentially of 50 atomic percent tellurium and 50 atomic percent mercury.

12. A composite thermoelement comprising two different thermoelectric bodies bonded together by a solder layer consisting essentially of 30 to 50 atomic percent tellurium, balance mercury, each said thermoelectric body being composed of at least 5 weight percent of at least one element selected from the group consisting of sulfur, selenium and tellurium.

References Cited in the file of this patent

UNITED STATES PATENTS

| | | |
|---|---|---|
| 1,963,085 | Gray | June 19, 1934 |
| 2,953,690 | Lawson et al. | Sept. 20, 1960 |